United States Patent Office 3,514,409

Patented May 26, 1970

3,514,409

COMPOSITION AND METHOD FOR ETCHING PHOTOENGRAVING COPPER PRINTING PLATES

Paul Borth, Park Forest, and Joseph McKeone, Hazelcrest, Ill., assignors to Photo-Engravers Research Institute, Incorporated, Savannah, Ga., a corporation of Georgia No Drawing. Filed Jan. 26, 1967, Ser. No. 611,797
Int. Cl. C23f *1/02;* B41c *1/00*
U.S. Cl. 252—79.3 11 Claims

ABSTRACT OF THE DISCLOSURE

An aqueous composition for use in etching photoengraving copper printing plates containing ferric chloride, a film forming composition and an amide or thioamide of an organic carbocyclic acid as a modifying agent.

The use of this composition provides a method whereby fine screen halftone and line work can be etched simultaneously in one etch.

BACKGROUND OF THE INVENTION

This invention relates to a composition and method for etching photoengraving copper printing plates. More particularly this invention relates to a composition and method of powderless etching photoengraving copper printing plates whereby fine screen halftone and line work can be etched simultaneously on a printing plate.

Photoengraving copper printing plates which can be copper or brass, are made by depositing a photosensitive film on the plate, impressing on the film the image to be printed by exposing the film to light passed through a negative of the image, removing the unexposed film (which overlies the image area), and providing the remainder of the film (which serves to define the image area) with a hardened and acid resistant coating by chemically treating or by baking the exposed portions of the film. The plate is then contacted with an etching solution, so that the solution attacks the copper of the image area, but not the copper covered by the acid resistant coating. By this means, the image is provided in relief on the plate.

Heretofore, one of the problems encountered during the etching procedure has been side wall etching and undercutting. As the depth of the etch increases, the sides of the metal supporting the resist are exposed to the etching solution which tends to undercut the resist along the side wall edges. This often results in a printing surface which is not a true representation of the image transferred to the sensitized metal. Recently, means have been provided for protecting the plate from such undercutting by incorporating various film forming agents in the ferric chloride etching bath. These film-forming agents serve to diminish undercutting by forming an etch-resistant film during etching on the surface of the side walls of the plate, thereby giving a protective film on the side walls of the resist and protecting the same from etching. However, in order to continue the etching process, it is necessary to remove the film from the bottom portions of the area to be further etched in a manner so as to not remove the film from the side walls to be protected. Conventionally this film removal is accomplished by some form of mechanical action, such as by splashing or spraying the etching solution against the plate thereby to direct finely divided droplets of solution toward the plate surface at comparable velocities, by a brushing action, or by a forced flow of the solution against the plate. In utilizing the splashing technique, the etching solution travels substantially perpendicular to the image area and upon striking the image area, abrades away any film which has formed. The splash of course, also strikes the side walls but the angle of incidence with the side walls is such that the protective film on the side walls is not removed.

In practice, the use of film formers has proven extremely advantageous when the etched area is an area having a large diameter such as occurs in line work. This is due to the fact that there is a great separation between the side walls of the etched area. Hence the angle at which the etching solution hits the area to be etched and the angle at which the solution hits the side walls will be different allowing the film to be abraded from the area to be etched and not abraded at the side walls. However in fine screen halftone etching where the diameter of the etched area is very small such as in the open areas of type characters such as a's, e's, etc., the angle at which the etching solution strikes the etched area will not be greatly different from the angle at which the etching solution strikes the side walls. Hence the necessary abrading action of etching area and the non-abrasion of the protective film at the side walls will not take place when there are areas of a small diameter to be etched.

In order to overcome this problem, workers in the field have utilized a different type of etching procedure for etching the fine half-screen, halftone dots from that utilized in line work. Therefore, it has always been desired in the art of etching photoengraving copper to provide a method and a solution whereby fine screen halftone and line work can be etched simultaneously in a single step.

It is a primary object of this invention to provide a ferric chloride etching bath which can be utilized to etch small open areas without undercutting the side walls of these small open etched areas.

It is a further object of this invention to provide a composition which will simultaneously etch fine screen halftone and line work.

It is a further object of this invention to provide a method for simultaneously etching fine screen halftone and line work simultaneously on photoengraving copper.

These and other objects of this invention will become apparent from the following detailed disclosure of the invention.

SUMMARY OF INVENTION

In accordance with this invention, it has been found that when a film modifier, which can either be an acid amide of an organic acid containing 2 to 7 carbon atoms, an amide of a thio acid containing from 2 to 7 carbon atoms, a dithidoxamide, or a mixture thereof is added to a ferric chloride aqueous etching solution having incorporated therein a film forming composition composed of a formamidine disulphide compound which can be either formamidine disulphide, substituted formamidine disulphide or salts thereof and a thiourea compound which can either be thiourea, a dimer of thiourea, ethylene thiourea or substituted ethylene thiourea, an etching composition is formed which can simultaneously etch halftone dots and line work. Furthermore, this composition improves the protection of halftone dots so that fine screen halftones of approximately 0.0008" in diameter can be etched. Additionally, the etching solution of this invention can etch open areas to from about 0.015" to 0.022" in depth while etching areas such as halftone dots which are from about 0.0012" to 0.002" in diameter, with negligible etch reduction in the diameter of the halftone dots or in the width of the line elements. Hence, by means of this invention, a composition is provided which will etch in a single bite a combination line and screen halftone plates.

The phenomena whereby etching of halftone dots of approximately 0.0008" in diameter and line areas of from about 0.015" to about 0.022" in depth is achieved is attributable to the combination of the film forming composition containing the formamidine disulphide compound and the thiourea compound with the modifying agents hereinbefore designated. This is seen by the fact that if the film forming composition does not contain both the formamidine disulphide compound and the thiourea compound, the presence of the amide modifying agent in the etching solution will not provide an etching solution which can etch halftone dots of a diameter of 0.0008". This is true since it has been found that when an etching solution was provided which contained the modifying agent, and a thiourea compound as the sole film forming agent, no improvement in the etching of small halftone dots occurred. The same is true when an etching solution contained the modifying agent and a formamidine disulphide compound as the sole film forming agent was utilized. Therefore, it is only by the combination of a formamidine disulphide compound, a thiourea compound, and an amide film forming agent, that the new and unexpected etching results of this invention occur.

The ferric chloride which is present in the etching solution is preferably used in a concentration of from about 20° Bé. (a 20% parts by weight aqueous solution of ferric chloride) to about 48° Bé. (a 50% parts by weight aqueous solution of ferric chloride). The most preferred concentration of the ferric chloride is about 30° Bé. (a 30% parts by weight aqueous solution of ferric chloride).

In accordance with this invention, the film forming composition must contain a thiourea derivative such as ethylene thiourea in combination with a formamidine disulphide compound. Film forming agents of this type which are utilized in accordance with this invention, are disclosed in U.S. Pat. No. 3,138,100. Generally, the film forming agent is added to the etching solution in an amount of from 0.5 to about 20 grams per liter.

The formamidine disulphide compound can be formamidine disulphide itself, salts of formamidine disulphide, substituted formamidine disulphide and salts of substituted formamidine disulphide. These formamidine disulphide film forming agents are taught in U.S. Pat. No. 3,033,725, May 8, 1962, Daugherty et al. Among the preferred formamidine disulphide compounds are included formamidine disulphide hydrochloride, formamidine disulphide hydroiodide, formamidine disulphide picrate, etc. Also suitable are salts of a disulphide of a substituted fromamidine in which one or more of the hydrogen atoms of the formamidine group are substituted by an alkyl group or an aryl group, such as phenyl, diphenyl, butyl, dibutyl, diisopropyl etc. The term "formamidine disulphide compound" denotes all of the above compounds. In general, the formamidine disulphide compound is present in the etching solution in a concentration of from about 0.25 to about 10 grams per liter.

The thiourea compounds which can be utilized in accordance with this invention are disclosed in such patents as U.S. Pat. No. 2,746,898, Jones, U.S. Pat. No. 3,148,100, Elston. These compounds include ethylene thiourea, thiourea, cuprous thiourea chloride and mixtures of the above. Generally, it is preferred that the etching solution in accordance with this invention include the thiourea compound in an amount sufficient to provide from about 0.25 to about 10 grams of the thiourea compound per liter of the ferric chloride etching solution. The film modifying agent which is utilized in this invention is generally present in the etching solution in an amount of from 0.10 gram per liter to about 10 grams per liter of the ferric chloride etching solution. While amounts of the film modifying agent greater than 10 grams per liter can be utilized in the etching solution of this invention, it is seldom necessary to add such great amounts to the etching solution. This is true since no additional beneficial results are produced by adding large amounts of film modifying agents.

As the film modifying agent any organic compound which is an amide of an organic acid or a thioacid containing from 2 to 7 carbon atoms will produce the beneficial results of this invention. Among the amides which can be utilized in accordance with this invention are included acrylamide, malonamide, acetic acid amide, benzoic acid amide, propionamide, thioacetamide, thiopropionamide, etc.

The present invention is applicable to the treatment of copper photoengraving plates which may contain about 99.99% parts by weight of copper, or which may contain a small amount (about 0.08% parts by weight) of silver, as well as true copper alloy photoengraving plates such as brass (up to 40% zinc, balance copper) and beryllium copper (from about 1% to about 4% parts by weight of beryllium, balance copper). This invention is also applicable to the treatment of nickel alloy plates such as Kovar (29% parts by weight of nickel, 17% parts by weight of copper, 55% parts by weight of iron, 1% parts by weight other). Nickel appears to react with thiourea derivatives in such the same manner as copper.

The etching bath of this invention may contain any of the conventional additives utilized to improve the etch rate of the bath, control the film formed by the thiourea derivatives, etc. Typical modifying agents which may be included in the composition of this invention are: pyrogallol, 2,4-diaminophenol dihydrochloride, tannic acid, as well as the other agents set forth in U.S. Pat. No. 3,161,552, Bradley et al. such as monochloroacetic acid, dichloroacetic acid, monobromoacetic acid, sodium acetate, etc. Any conventional additives may be utilized in the ferric chloride etching bath of this invention.

Any conventional etching procedure may be utilized to apply the etching composition of this invention to etch any of the aforementioned metallic materials. Among the conventional techniques which may be utilized to apply the etching composition of this invention as an etchant for the aforementioned metallic materials include splashing, brushing, force flow, etc. Any conventional etching machine may be utilized to apply the composition of this invention to the aforementioned metallic materials. Among the typical machines which may be utilized are included Master PC-32 etching machine, sold by Master Etching Machine Company of Wyncote, Pa., "Kopre-Matic" manufactured by Chemco Photo Products and "Empire" manufactured in Denmark by Brdr. Luth.

The following examples is intended to merely illustrate the invention and should not be construed as a limitation on the scope of the invention.

EXAMPLES 1–8

Etching solutions were prepared containing each of the modifiers in the concentration set forth in the following table. The etching solution utilized was 30° Bé ferric chloride solution containing about 2.7 grams per liter of a film forming composition comprising 9% by weight of amidol, 43% by weight of formamidine disulfide dihydrochloride and 48% by weight of ethylene thiourea. This etching solution was applied to copper plates bearing a photo resist image of a line and half-tone pattern. The copper plates were etched in a paddle type etching machine for a period of time, line depth and half-tone depth indicated in the following table. The temperature during the etching procedure was 80° F. The effectiveness of the etching solution was measured by the diameter of the smallest retained halftone dot which was etched by the solution. This indicated the ability of the etching solution to etch a dot of a sufficient size. The results of this is tabulated in the following table.

AMIDES IN POWDERLESS COPPER ETCHING

| Example amide used | Concentration (gm./l.) | Paddle speed (r.p.m.) | Etch time (min.) | Line depth (in.) | Halftone depth (in.) | Initial diameter of smallest retained halftone dot (in.) |
|---|---|---|---|---|---|---|
| (1) Propionamide | 0.57 | 650 | 15 | .015 | .004 | 0.002 |
| (2) Propionamide | 1.3 | 700 | 15 | .022 | .003 | 0.0015 |
| (3) Thioacetamide | 0.015 | 600 | 16 | .020 | .003 | 0.002 |
| (4) Malonamide | 0.27 | 600 | 16 | .019 | .0025 | 0.002 |
| (5) Benzamide | 0.39 | 600 | 25 | .030 | .0025 | 0.0012 |
| (6) Acrylamide | 0.015 | 600 | 11 | .015 | .003 | 0.002 |
| (7) Thiooxamide | 0.19 | 600 | 11 | .018 | .0025 | 0.002 |
| (8) None | | 600 | 13 | .018 | .006 | 0.005 |

As seen from the above table, the use of a modifying agent in accordance with this invention produces an etching solution which can etch half tone dots of a diameter of at least ½ that of the half tone dot which can be etched by a solution which does not contain a modifying agent. This is shown by the fact that the smallest retained half tone dot produced by etching a solution which did not contain the modifying agents in accordance with this invention was approximately 0.005" whereas the smallest retained halftone dot produced by means of the etching solution of this invention had a diameter of 0.0015". Therefore it can be seen that the etching composition of this invention can be utilized to etch halftone dots having a very small diameter.

While the invention has been described with reference to particular embodiments thereof, modifications and variations will occur to those skilled in the art, and it is desired to secure by this letters patent all such modifications.

What is claimed is:

1. An etching bath composition comprising an aqueous solution of 30° Bé. ferric chloride at a temperature in the range of 80° F., a film former composition, composed of a formamidine disulfide compound selected from the group consisting essentially of thiourea, a dimer of thiourea, ethylene thiourea, substituted ethylene thiourea and mixtures thereof, and a modifier selected from the group consisting of propionamide, thioacetamide, malonamide, benzamide, acrylamide, thiooxamide, dithiooxamide, and benzoic acid amide.

2. An etching bath composition as claimed in claim 1 wherein said film former composition is composed of formamidine disulfide and ethylene thiourea in an amount of 2.7 gram liter.

3. The etching bath composition as claimed in claim 1 wherein said modifier is malonamide.

4. The etching bath composition as claimed in claim 1 wherein said modifier is benzamide.

5. The etching composition as claimed in claim 1 wherein said modifying agent is propionamide.

6. The etching composition of claim 1 wherein said film modifying agent is thioacetamide.

7. The etching composition of claim 1 wherein said film modifying agent is dithiooxamide.

8. A process of etching photoengraving copper to make therein an image in relief which comprises providing a copper plate having its image area exposed for etching, and contacting the image area with an etching solution wherein said etching solution is composed of an aqueous solution of ferric chloride, a film former composition, said film former composition being composed of a formamidine disulfide compound selected from the group consisting of formamidine disulfide, substituted formamidine disulfide and salts thereof and a thiourea compound from the group consisting of thiourea, a dimer of thiourea, ethylene thiourea, and substituted ethylene thiourea, and a modifying agent selected from the group consisting of amides of organic acids containing from 2 to 7 carbon atoms, amides of thioacids containing from 2 to 7 carbon atoms, dithiooxamide, and mixtures thereof.

9. The process of claim 8 wehrein said film forming composition is composed of formamidine disulfide and ethylene thiourea.

10. The process of claim 8 wherein said modifying agent is thioacetamide.

11. The process of claim 8 wherein said modifying agent is an amide of an organic acid containing from 2 to 7 carbon atoms.

References Cited

UNITED STATES PATENTS 3,161,552 12/1964 Bradley et al. ---------- 156—14

JACOB H. STEINBERG, Primary Examiner

U.S. Cl. X.R.

156—14